(12) United States Patent
Schuppener (10) Patent No.: US 8,841,972 B2
(45) Date of Patent: Sep. 23, 2014

(54) ELECTRONIC DEVICE, FIBER-OPTIC COMMUNICATION SYSTEM COMPRISING THE ELECTRONIC DEVICE AND METHOD OF OPERATING THE ELECTRONIC DEVICE

(71) Applicant: Texas Instruments Deutschland GmbH, Freising (DE)

(72) Inventor: Gerd Schuppener, Lehrte (DE)

(73) Assignee: Texas Instruments Deutschland GmbH, Freising (DE)

( * ) Notice: Subject to any disclaimer, the term of this patent is extended or adjusted under 35 U.S.C. 154(b) by 46 days.

(21) Appl. No.: 13/656,434

(22) Filed: Oct. 19, 2012

(65) Prior Publication Data

US 2014/0111280 A1 Apr. 24, 2014

(51) Int. Cl.
*H03F 3/08* (2006.01)
(52) U.S. Cl.
USPC .................................. 330/308; 330/9; 330/75
(58) Field of Classification Search
CPC ........................................................ H03F 3/08
USPC ................................................ 330/308, 9, 75
See application file for complete search history.

(56) References Cited

U.S. PATENT DOCUMENTS

| | | | |
|---|---|---|---|
| 5,638,163 A * | 6/1997 | Nourrcier, Jr. ............... 356/5.01 |
| 6,002,299 A * | 12/1999 | Thomsen ......................... 330/9 |
| 6,624,405 B1 * | 9/2003 | Lau et al. ................ 250/214 LA |
| 7,536,114 B2 * | 5/2009 | Gieseler et al. ............... 398/210 |
| 7,760,022 B2 * | 7/2010 | Yamada ......................... 330/255 |
| 8,031,094 B2 * | 10/2011 | Hotelling et al. ............. 341/143 |
| 8,456,237 B2 * | 6/2013 | Huang et al. .................. 330/282 |
| 2004/0119539 A1 | 6/2004 | Seetharaman et al. |
| 2005/0052248 A1 | 3/2005 | Visocchi |
| 2005/0200421 A1 | 9/2005 | Bae et al. |
| 2012/0268145 A1 * | 10/2012 | Chandra et al. ............... 324/686 |

FOREIGN PATENT DOCUMENTS

| JP | 2000174567 | 6/2000 |
|---|---|---|
| KR | 10 20110073171 | 6/2011 |

* cited by examiner

*Primary Examiner* — Patricia Nguyen
(74) *Attorney, Agent, or Firm* — Alan A. R. Cooper; Frederick J. Telecky, Jr.

(57) ABSTRACT

An electronic device, a fiber-optic communication system comprising the electronic device and a method of operating the electronic device are provided. The electronic device comprises a transimpedance-type amplifier having a transimpedance stage comprising an amplifier which is coupled in series with an input node. A feedback resistor is coupled in series between an output node of the amplifier and an inverting input node of the amplifier to provide a virtual ground node which is coupled to the input node, the inverting input node of the amplifier and to the feedback resistor. A current source is coupled to the virtual ground node so as to compensate for an offset current in an input signal which is coupled to the input node of the electronic device. Further, the electronic device comprises a control stage which is configured to control the current source as a function of a current through the feedback transistor.

6 Claims, 5 Drawing Sheets

ELECTRONIC DEVICE, FIBER-OPTIC COMMUNICATION SYSTEM COMPRISING THE ELECTRONIC DEVICE AND METHOD OF OPERATING THE ELECTRONIC DEVICE

TECHNICAL FIELD

The invention relates to an electronic device comprising a transimpedance-type amplifier. Further, the invention relates to a fiber-optic communication system comprising a photodiode and the electronic device having the transimpedance-type amplifier. The invention further relates to a method of operating an electronic device comprising a transimpedance-type amplifier.

BACKGROUND

Transimpedance amplifiers (also referred to as current-to-voltage converters) convert and amplify an input current into an output voltage. Best performance and high dynamic range of transimpedance amplifiers is achieved if the input current of the transimpedance amplifier does not comprise a direct current (DC) component. Transimpedance-type amplifiers are frequently used in fiber-optic communication systems to detect and to amplify a signal current from a photodiode which detects an optical data signal. The output signal/output current of the photodiode (which is more or less directly proportional to the illumination light power and therefore more or less directly proportional to the optical data signal) is converted into a voltage signal which is used for subsequent data processing steps. Sensitivity of a receiver in a fiber-optic communication system and the dynamic range thereof is mainly determined by the transimpedance amplifier stage.

Figure 1A:
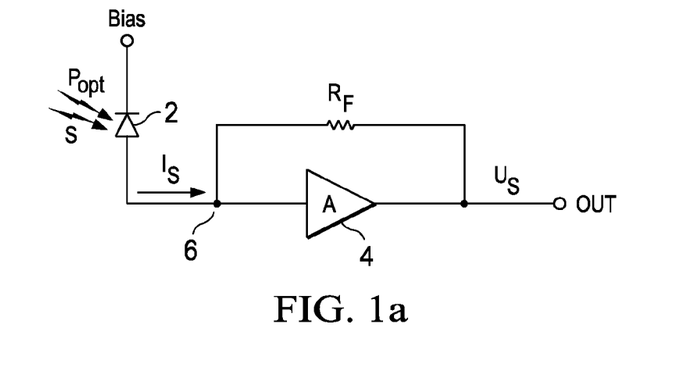
FIG. 1(a) is a simplified circuit diagram of a transimpedance-type amplifier according to the prior art.

The principle of signal conversion in a fiber-optic communication system is illustrated by the simplified circuit diagram of FIG. 1(a). There is a photodiode 2 receiving an optical data signal S having a power P_OPT. The photodiode 2 is coupled to a bias supply voltage BIAS and the photocurrent I_S of the photodiode 2 is coupled to an input of an amplifier 4. A feedback resistor R_F is coupled between the input and an output of the amplifier 4. Accordingly, there is a virtual ground node 6 which is coupled to the input of the amplifier 4. An output voltage U_S is provided at an output node OUT of the transimpedance amplifier. If the gain of the transimpedance amplifier is significantly higher than 1, the transimpedance gain equals the value of R_F and the current in the feedback resistor R_F is equal to the signal current I_S.

However, for optimum performance at highest dynamic range, the input current I_S should be bidirectional. In other words, the input current I_S should flow in and out of the amplifier 4 with preferably the same amplitude. A photodiode 2 however provides a uni-directional current, and accordingly, there is a DC current component in the signal current I_S.

Figure 1B:
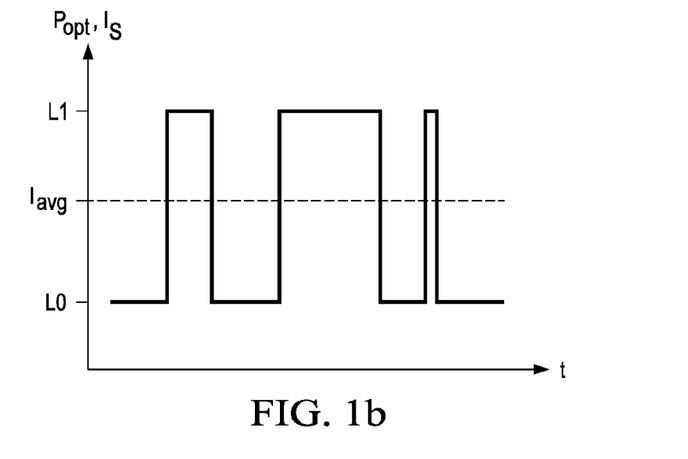
FIG. 1(b) is a time-dependent output signal of a photodiode receiving a digital optical signal.

FIG. 1(b) illustrates a time-dependent signal current I_S of a photodiode 2 in a fiber-optic communication system. The signal current I_S alternates between a first current level L0 which is identified with the bit information "0" and a second current level L1 which is identified with the bit information "1". The current level L0 is greater than zero current, because the light source (typically a laser) which is applied for optical data transmission is not completely switched off, if a "zero" bit is communicated. Both current levels L0, L1 are greater than zero (current), and accordingly, there is an average DC offset current I_AVG in the signal current I_S. Even if the current level L0 for a "zero" bit is set to zero current, there will be an average DC offset current which is equal to half the peak current.

Figure 2A:
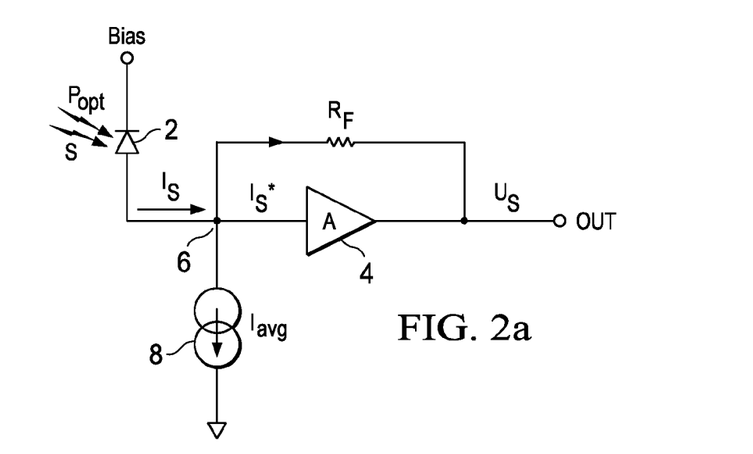
FIG. 2(a) is a simplified circuit diagram of a transimpedance-type amplifier comprising an compensating current source, according to the prior art.
Figure 2B:
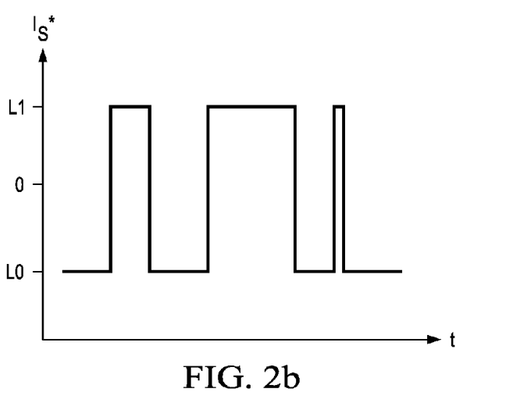
FIG. 2(b) is a time-dependent output current of a photodiode receiving an optical digital signal, wherein the current signal is compensated for a DC component.

The DC current component in the signal current I_S of the photodiode 2 may be reduced by introduction of an additional current source which is coupled to the input of the transimpedance amplifier and will subtract the average DC current I_AVG from the signal current I_S which is delivered by the photodiode 2. In FIG. 2(a), there is a further simplified circuit diagram of a transimpedance amplifier, wherein an additional current source 8 is coupled to the virtual ground node 6 so as to subtract the average DC current I_AVG from the input signal I_S. The modified signal I_S*, which is equal to the current across the feedback resistor R_F, is shown in the time-dependent simplified diagram of FIG. 2(b). The current level L0, which is identified with bit information "0", is negative (i.e., below zero current) and the current level L1 (of the modified input signal I_S*) which is identified with bit information "1" is above zero current. Now, the averaged value of the input current I_S* is very close to zero current. However, introduction of the additional current source 8 for subtracting the average current I_AVG from the signal current I_S introduces additional noise. If the transimpedance amplifier is used within a fiber-optic communication system, this may significantly affect the sensitivity of the receiver.

Figure 3:
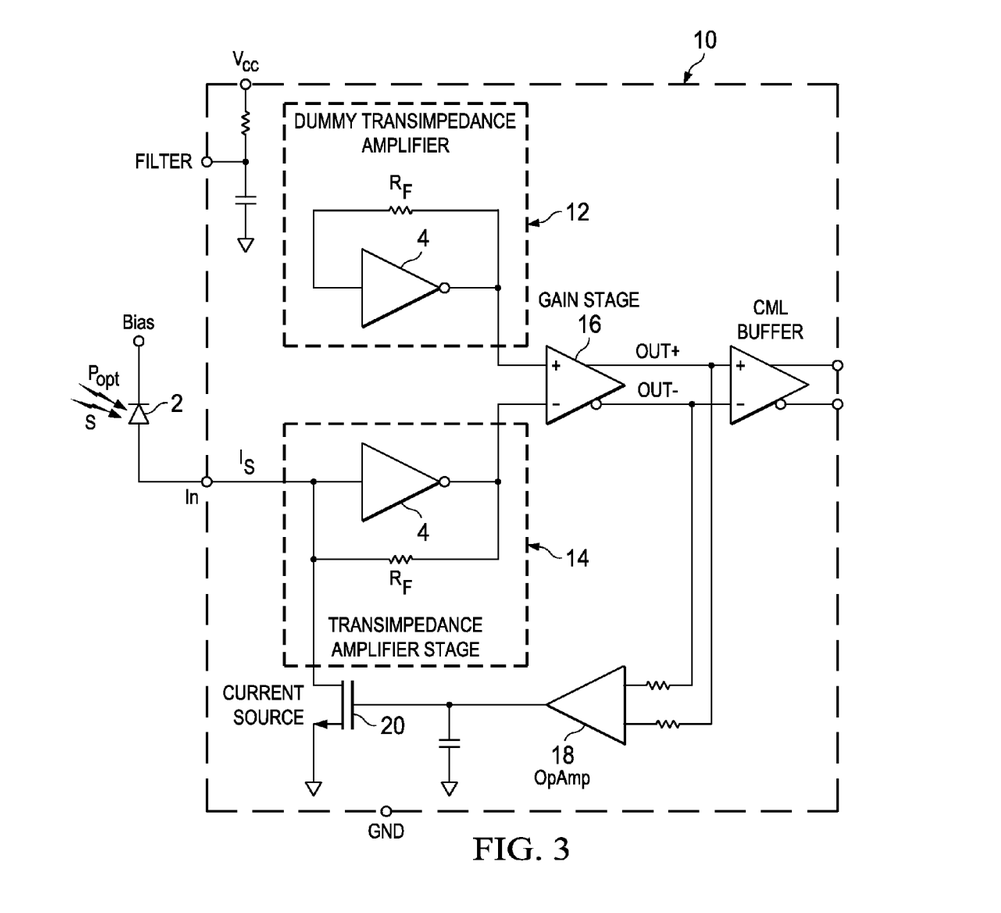
FIG. 3 and FIG. 4 are simplified circuit diagrams of preamplifier circuits comprising a transimpedance-type amplifier and regulation loops for compensating a DC current component, according to the prior art.

In FIG. 3, there is a more detailed simplified circuit diagram of a preamplifier 10 in a fiber-optic communication system. The pre-amplifier 10 comprises an offset cancellation stage having a dummy transimpedance amplifier 12. The dummy transimpedance amplifier 12 is configured similar to the transimpedance amplifier 14, and it is used to generate a reference voltage which is equal to the output voltage of the transimpedance amplifier 14, if there is zero input current. The dummy transimpedance amplifier 12 and the transimpedance amplifier 14 both comprise an amplifier 4 and a feedback resistor R_F which is coupled between an output of the amplifier 4 and an input thereof. The output of the dummy transimpedance amplifier 12 is coupled to a non-inverting input of a gain stage 16 and the output of the transimpedance amplifier 14 is coupled to an inverting input of the gain stage 16. The gain stage 16 comprises an output OUT+ and an inverting output OUT−. The offset cancellation stage comprises an operational amplifier 18 which is coupled to the output OUT+ and to the inverting output OUT− of the gain stage 16, with a respective one of its inputs. The output of the operational amplifier 18 is coupled to a current source 20 for generation of a DC offset current which is subtracted from the signal current I_S. The signal current I_S of the photodiode 2 is sensed at the input node IN of the pre-amplifier 10. Preferably, the value of the offset current which is generated by the current source 20 is more or less equal to the value of the average DC current I_AVG which is included in the signal current I_S of the photodiode 2.

However, the pre-amplifier 10 in FIG. 3 comprises a dummy amplifier 12 which has a negative impact on the power consumption of the system. Further, the offset cancellation loop not only cancels an offset which is generated by the DC content in the input signal I_S, but also cancels all offsets present in the loop. The DC current which is subtracted by the current source 20 from a signal which is coupled to the input IN may not necessarily be identical to an average DC input current of the photodiode 2. The effect may vary from part to part due to offset caused by mismatch of components. Further, the receiver's sensitivity is influenced by the noise contribution of the current source 20. Consequently, the circuit of FIG. 3 is not a preferred circuit for high sensitivity receivers.

Figure 4:
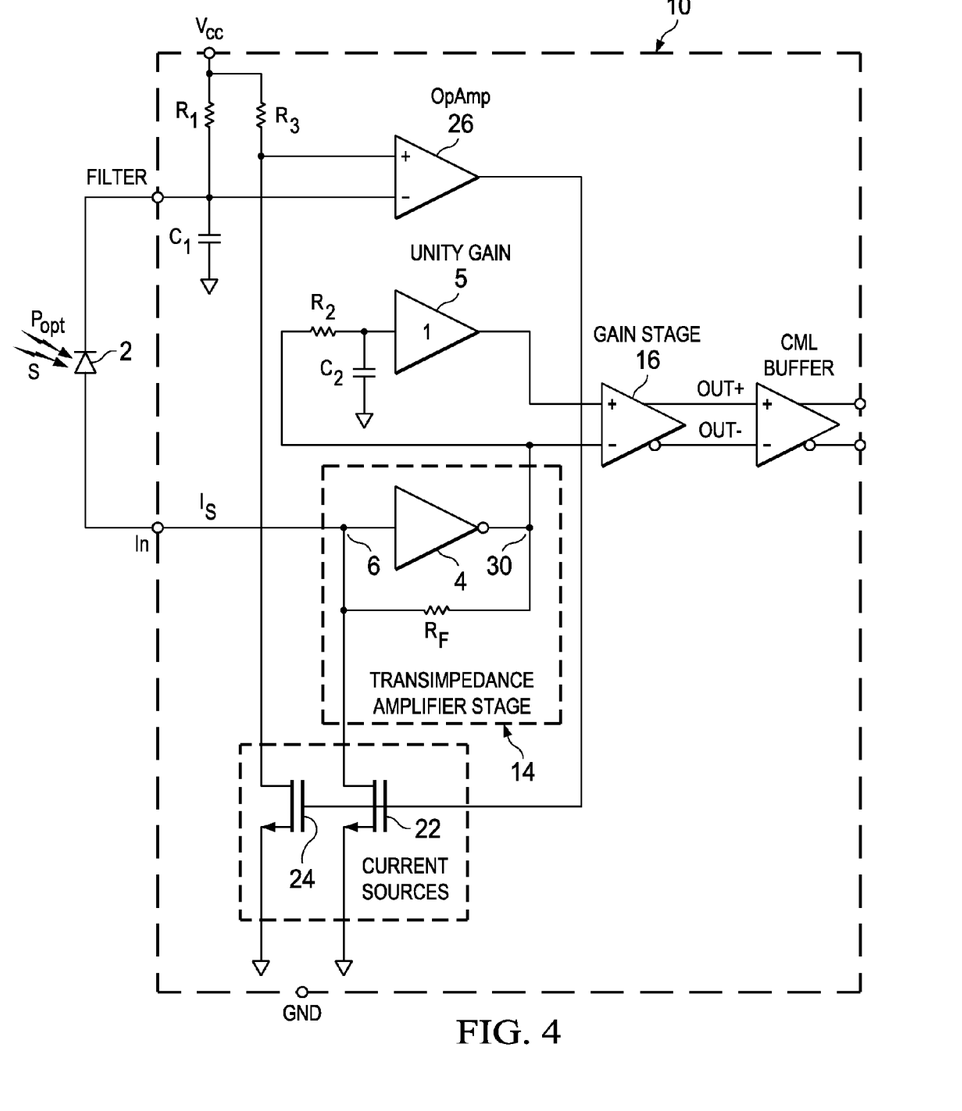

In FIG. 4, there is another pre-amplifier 10 for a fiber-optic communication system. The pre-amplifier 10 comprises a low pass filter comprising a resistor R1 and a capacitor C1 which are coupled in series between a supply voltage line VCC and ground. A node between the resistor R1 and the capacitor C1 provides a supply voltage to the photodiode 2. The pre-amplifier 10 receives an input signal current I_S at the input N. The input signal current I_S is coupled to a transimpedance amplifier 14. The transimpedance amplifier 14 comprises an amplifier 4 and a feedback resistor R_F. Further, there is a unity gain buffer comprising an operational amplifier 5, a resistor R2 and a capacitor C2. The unity gain buffer is coupled between a non-inverting input and an inverting input of a gain stage 16. The output of the transimpedance amplifier 14 is coupled to a non-inverting input of the gain stage 16. The unity gain buffer uses a different amplifier 5 than the transimpedance amplifier 14. The unity gain buffer together with the RC-filter (which comprises the resistor R2 and the capacitor C2) extracts and buffers the common mode voltage at the output 30 of the transimpedance amplifier 14. The unity gain buffer provides a reference for the following gain stage (voltage amplifier) 16.

The pre-amplifier 10, according to FIG. 4, takes advantage of the fact that a bias voltage for the photodiode 2 is provided through an on-chip low pass filter (R1, C1). The average DC current of the photodiode 2 will flow through resistor R1, thus creating a voltage drop across the resistor R1. There is another resistor R3 which is matched to resistor R1. An offset cancellation stage further comprises an operational amplifier 26 which is for controlling a first and a second transistor 22, 24 which act as current sources. The operational amplifier 26 senses a voltage difference between the voltage drop across resistor R1 and the voltage drop across the matched resistor R3. Therefore, it senses the bias current (i.e., the DC current component through the photodiode 2). The output of the operational amplifier 26 is coupled to the gates of the two transistors 22, 24. The current source is controlled, in that the voltage drop across the two resistors R2, R3 is identical. If the two current sources (i.e., the two transistors 22, 24), are matched devices, the transistor 22 will subtract an identical current from the virtual ground node 6 and consequently subtract the DC current component from the input current I_S. In the pre-amplifier stage 10, according to the simplified circuit diagram of FIG. 4, there is no need for a dummy amplifier. However, the photodiode 2 needs to be biased from the on-chip low pass filter (R1, C1), and accordingly, the circuit does not work for externally biased photodiodes.

SUMMARY

It is an object of the invention to provide an improved electronic device having a transimpedance-type amplifier and to provide an improved fiber-optic communication system comprising the electronic device.

In one aspect of the invention, an electronic device comprising a trans-impedance-type amplifier having a transimpedance stage is provided. The transimpedance stage comprises an amplifier which is coupled in series with an input node of the electronic device. Further, there is a feedback resistor which is coupled in series between an output node of the amplifier and an input node of the amplifier so as to provide a virtual ground node at the input. The virtual ground node is coupled to the input node of the electronic device, the input node of the amplifier and to the feedback resistor. The electronic device comprises a current source which is coupled to the virtual ground node so as to compensate for a DC current component in an input signal, preferably in an input current, which is coupled to the input node of the electronic device. The electronic device, according to aspects of the invention, further comprises an offset cancellation stage which is for cancelling the DC offset current component in the input signal. The offset cancellation stage is configured to control the current source as a function of a current through the feedback resistor. Preferably, the offset cancellation stage is configured to control a value of a current which is generated by the current source as a function of a voltage drop across the feedback resistor.

The electronic device, according to aspects of the invention, senses a DC current across the feedback resistor. The offset cancellation stage adjusts the current source in that the resulting DC current across the feedback resistor is equal to zero. The electronic device does not need an additional dummy amplifier, and further, it can be applied to any kind of photodiodes, both, internally and externally biased.

According to an embodiment of the invention, there is a low pass filter which is coupled between the transimpedance amplifier stage and the current source. Preferably, the offset cancellation source comprises the low pass filter. The low pass filter may comprise a resistor which is coupled to a first side or to a second side of the feedback resistor and a capacitor which is further coupled to ground. Preferably, the low pass filter comprises a first resistor which is coupled to a first side of the feedback resistor and the output of the amplifier of the transimpedance stage. An opposite side of the first resistor may be coupled to an input of the operational amplifier of the offset cancellation stage. Further, the low pass filter may comprise a second resistor which is coupled to a second side of the feedback resistor and the input of the amplifier of the transimpedance stage. An opposite side of the second resistor may be coupled to a different input of the operational amplifier of the offset cancellation loop. For example, the first resistor is coupled to an inverting input of the operational amplifier and the second resistor is coupled to a non-inverting input of the operational amplifier. The low pass filter further comprises a capacitor which is preferably coupled between an output of the operational amplifier and ground. However, instead of a single capacitor which is coupled to the output of the operational amplifier, there may be two capacitors which are coupled between a respective one of the inputs of the operational amplifier and ground. The resistors of the low pass filter decouple the operational amplifier of the offset cancellation stage from the sensitive input nodes of the transimpedance amplifier stage which may receive small input current signals from the photodiode.

The offset cancellation stage comprises an operational amplifier, wherein a first input node of the operational amplifier, the feedback resistor and a second input node of the operational amplifier are coupled in series. An output of the operational amplifier may be coupled to the current source so as to control a value of the compensating current which is drawn from the virtual ground node by said current source. The value of the compensating current is a function of a current through the feedback resistor. Preferably, the value of the compensating current is a function of the voltage drop across the feedback resistor.

There may be an operational amplifier having a threshold. Further, the threshold of the operational amplifier may be adjustable. Additional circuitry may be implemented, which is for adjusting the threshold of the operational amplifier. The current source will be activated only if the current across the feedback resistor exceeds this predetermined threshold. In other words, the operational amplifier may be selected in accordance with a reasonable predetermined threshold for activation and de-activation of the current source. This is advantageous in that, the current source may be switched off for small input currents. This will lower the noise at the input node of the transimpedance amplifier, and accordingly, there is an increased sensitivity of the electronic device, which may be a pre-amplifier stage in a fiber optic communication system. The noise is lowered due to deactivation of the current source which contributes to the noise in the input current.

According to another embodiment of the invention, the current source comprises a transistor, for example, a MOS transistor. A channel of the transistor may be coupled between the virtual ground node and ground. Further, a gate of the transistor may be coupled to the output node of the operational amplifier. If there is a low pass filter in the offset cancellation stage, the capacitor of the low pass filter is coupled to the gate of the transistor and to the output of the operational amplifier, at a first side, and to ground on a second side.

According to another embodiment, the transistor of the current source is a bipolar transistor. A collector of the bipolar transistor is coupled to the virtual ground node and an emitter of the bipolar transistor is coupled to ground. A base of the bipolar transistor is coupled to the output node of the operational amplifier.

According to an embodiment of the invention, the transimpedance-type amplifier stage is configured to draw a DC offset current from the input node of the electronic device. The DC offset current may be drawn from the virtual ground node, for example. The DC offset current may be due to implementation of the transimpedance-type amplifier stage comprising bipolar transistors. A base of a bipolar transistor is coupled to the virtual ground node and the DC offset current is a base current of this bipolar transistor. Preferably, NPN-transistors are implemented.

The offset cancellation stage keeps a DC current across the feedback resistor equal to zero. The average DC current component, which is generated by the photodiode, is unidirectional and is greater than zero. The DC current across the feedback resistor is the average DC current component in the signal which is generated by the photodiode, minus a base current of the bipolar transistor. If the average DC current component in the signal of the photodiode is smaller than a base current of the bipolar transistor of the transimpedance-type amplifier stage, the current across the feedback resistor will be negative, which means that there is a negative voltage drop across the feedback resistor, and the current source is not be activated. The implementation of the transimpedance-type amplifier stage compensates for a positive voltage drop across the feedback resistor. A positive voltage drop across the feedback resistor would cause the operational amplifier of the offset cancellation stage to raise its output. This would activate the current source which however generates noise at the input of the transimpedance amplifier. A negative voltage drop across the feedback resistor causes the operational amplifier of the offset cancellation stage to drop its output to ground, hence deactivating the current source. As long as the direct current component in the signal current of the photodiode is smaller than the base current of the bipolar transistor of the transimpedance type amplifier stage, the current source will not be activated. In other words, for small input currents, the current source is de-activated. As explained previously, the current source at the amplifier input, when activated, contributes noise, thus worsening the sensitivity. For small input currents which are in a range of the base current, which is typically in the order of magnitude of µA, sensitivity is critical but not the dynamic range. There is not subtraction of the average current DC by the current source but a compensation of the DC current component in the signal of the photodiode due to the base current of the bipolar transistor. This will minimize noise. The bipolar implementation of the transimpedance amplifier stage has a built-in current source and the additional current source may be de-activated for input currents that are smaller than the base current of the bipolar transistor. Since implementations using common IC technologies yield to base currents in the order of tens µA, it is apparent that the base current induced offset covers the input current range where the transimpedance amplifier operates at its sensitivity limit.

According to another aspect of the invention, a fiber-optic communication system comprising the electronic device, according to aspects of the invention, is provided. Further, the fiber-optic communication system comprises a photodiode for detection of an optical data signal and the electronic device, according to aspects of the invention, is for conversion of an output signal/current of the photodiode into a voltage signal for subsequent data processing.

The fiber-optic communication system has a very low quiescent current and high sensitivity, in particular for low output currents of the photodiode.

Same or similar which have been mentioned with respect to the embodiments of the electronic device ally to the fiber-optic communication system in a same or similar way and are therefore not repeated.

BRIEF DESCRIPTION OF DRAWINGS

For a more complete understanding of the present invention, and the advantages thereof, reference is now made to the following descriptions taken in conjunction with the accompanying drawings, in which.

DETAILED DESCRIPTION OF EMBODIMENTS

Figure 5:
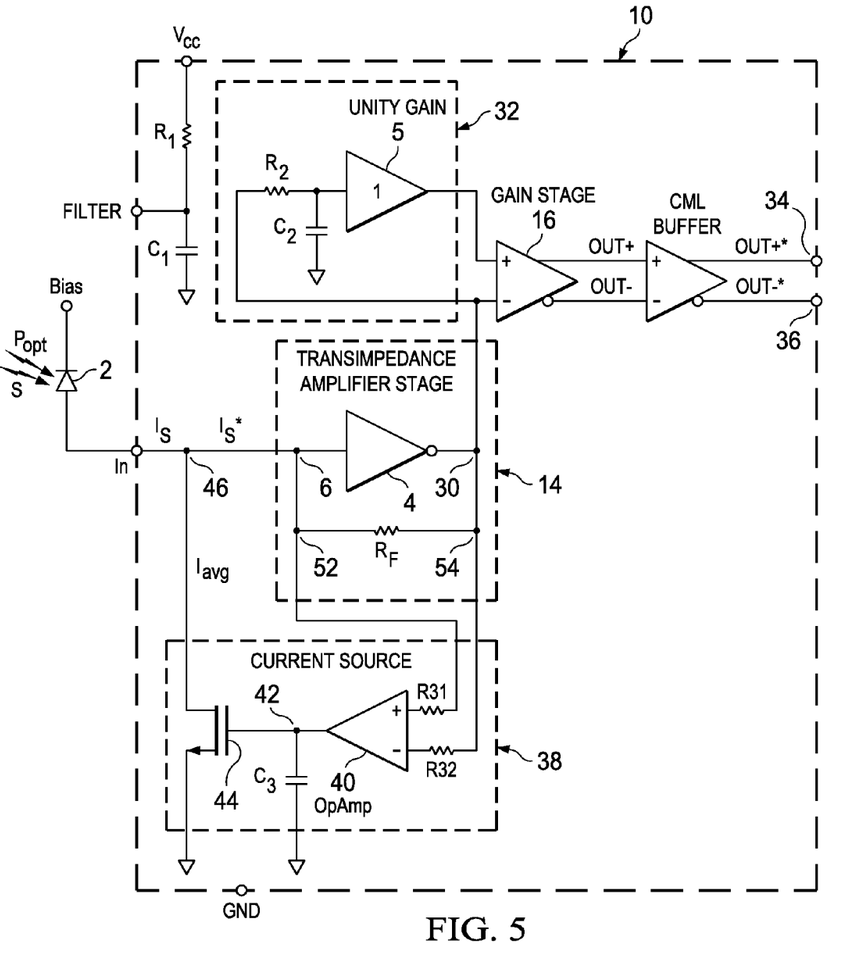
FIG. 5 is a simplified circuit diagram of an electronic device, according to an embodiment of the invention.

FIG. 5 is a simplified circuit diagram of an electronic device, preferably a pre-amplifier stage 10, according to an embodiment of the invention. The preamplifier stage 10 comprises a supply node which is coupled to a supply voltage line VCC. Further, there is ground terminal GND which is coupled to ground.

The pre-amplifier stage 10 may comprise an internal low pass filter comprising a resistor R1 and a capacitor C1 which are coupled in series between the supply voltage line VCC and ground. At a tapping point between the resistor R1 and the capacitor C1, there is an output node providing a filtered supply voltage at the terminal FILTER. The terminal FILTER may be coupled to a photodiode 2 for internally biasing the photodiode 2. However, according to the embodiment of FIG. 5, the photodiode 2 is externally biased and coupled to a supply node BIAS. The embodiment of FIG. 5 is suitable for both, internally biased and externally biased photodiodes 2.

The photodiode 2 receives an optical data signal S having a light power P_OPT. The photodiode 2 converts the optical signal S into a photocurrent which is the input signal current I_S and which is coupled to an input node IN of the pre-amplifier stage 10. A time-dependent signal current I_S of the photodiode 2 in a fiber-optic communication system is for example illustrated in FIG. 1(b). The photocurrent I_S alternates between a first current level L0 which is identified with the bit information "0" and a second current level L1 which is identified with bit information "1". There is an average DC offset current I_AVG in the signal current I_S. The DC current level is greater than zero current because the light source, which is applied for optical data transmission (typically a laser) is not completely switched off, if a "zero" bit is communicated.

The pre-amplifier stage 10 comprises a transimpedance amplifier stage 14 having an amplifier 4. The amplifier 4 is coupled in series with an input node IN of the pre-amplifier stage 10. A feedback resistor R_F is coupled between an output node 30 and an input of the amplifier 4. The input of the amplifier 4 is coupled to a virtual ground node 6 which is further coupled to the input node IN of the preamplifier stage 10.

There is a unity gain stage 32 comprising an operational amplifier 5 which is coupled in series between the inverting input of a gain stage 16 and the non-inverting input of the gain stage 16. The unity gain stage 32 further comprises an RC-filter having a resistor R2 and a capacitor C2, wherein the capacitor C2 is coupled between an input of the operational amplifier 4 and ground. The resistor R2 is coupled between the input of the operational amplifier 5 and an inverting input of the gain stage 16. An output of the operational amplifier 5 of the unity gain stage 32 is coupled to the non-inverting input of the gain stage 16. The unity gain stage 32 uses a different amplifier 5 than the transimpedance amplifier 14. The unity gain stage 32 together with the RC-filter (R2 and C2) extracts and buffers the common mode voltage at the output 30 of the transimpedance amplifier 14. The unity gain stage 32 provides a reference to the following gain stage 16.

The output node 30 of the transimpedance amplifier stage 14 is coupled to the inverting input of the gain stage 16. The gain stage 16 comprises a non-inverting output OUT+ and an inverting output OUT−. The outputs OUT+ and OUT− are coupled to the non-inverting and to the inverting input of the CML buffer, respectively. An output of the pre-amplifier stage 10 is provided at output nodes 34 and 36 via the CML buffer, wherein a non-inverting output OUT+* of the CML buffer is coupled to a non-inverting output node 34 of the pre-amplifier stage 10 and an inverting output OUT−* of the CML buffer is coupled to an inverting output node 36 of the pre-amplifier stage 10.

For a compensation of a DC current or offset current component in the input current signal I_S, which is coupled to the input IN and which is generated by the photodiode 2, there is an offset cancellation stage 38 comprising an operational amplifier 40. The operational amplifier 40 senses a current through the feedback resistor R_F of the transimpedance amplifier stage 14. To be more precise, the operational amplifier 40 senses a voltage drop across the feedback resistor R_F of the transimpedance-type amplifier stage 14. The operational amplifier 40 may have a threshold. Additional circuitry (not shown) may be implemented to provide the operational amplifier 40 with an adjustable threshold.

For sensing the voltage drop across the feedback resistor R_F, the non-inverting input of the operational amplifier 40 is coupled to a first node 52, which is coupled to the virtual ground node 6 and to a first side of the feedback resistor R_F. The inverting input of the operational amplifier 40 is coupled to a second node 54, which is coupled to the output node 30 of the amplifier 4 and to an opposite side of the feedback resistor R_F. There is a first resistor R31 which is coupled between the first node 52 and a first side of the feedback resistor R_F and the non-inverting input of the operational amplifier 40. Another resistor R32 is coupled between the second node 54 and a second side of the feedback resistor R_F and the inverting input of the operational amplifier 40. At the output of the operational amplifier 40, there is a capacitor C3 which is coupled to ground with its opposite terminal.

An output node 42 of the further operational amplifier 40 of the offset cancellation stage 38 is coupled to a current source 44 so as to compensate for an offset or DC current component in the input signal I_S. Preferably, the current source 44 is a transistor wherein a channel of the transistor is coupled between the input node IN and the virtual ground node 6, respectively, at a first side and to ground at the opposite side. A gate of the transistor may be coupled to the output node 42 of the operational amplifier 40. The first resistor R31 and the second resistor R32, together with the capacitor C3, provide a low pass filter. Further, the first resistor R31 and the second resistor R32 are for decoupling the operational amplifier from the sensitive nodes 52 and 54 and the virtual ground node 6, respectively.

The offset cancellation stage 38, according to the embodiment in FIG. 5, keeps a voltage across the feedback resistor R_F at least approximately equal to zero. This means, a current I_AVG is drawn or subtracted from the node 46 by the current source 44. This average offset current I_AVG, which is a DC current, is adjusted by the offset cancellation stage 38. The signal current I_S from the photodiode 2 alternates between the current levels L0 and L1, which are identified with the respective bit information. The DC current I_AVG is subtracted from the signal current I_S and an offset corrected current I_S* is coupled to the virtual ground node 6 and the input of the amplifier 4 of the transimpedance amplifier stage 14.

The operating point is adjusted and the dynamic range of the preamplifier stage 10 is extended. For optimum performance at highest dynamic range, the input current I_S* is bi-directional, which means the input current I_S* flows in and out of the amplifier 4 with preferably a same amplitude. Further, in the embodiment of FIG. 5, there is no need for a dummy amplifier stage and the photodiode 2 may be biased externally and internally.

The low pass filter comprising the capacitor C3 and the two resistors R31 and R32 prevents the offset cancellation stage 38, which controls the current source 44, from deteriorating the amplitude of the signal current I_S which is a fast alternating signal during data transmission.

According to an embodiment, there is an operational amplifier 40 having a threshold. The current source 44 will be activated only if the current across the feedback resistor R_F exceeds this predetermined threshold. In other words, there is a DC current component in the signal current I_S which exceeds a predetermined threshold. The operational amplifier 40 may be selected in accordance with this threshold. Further, the threshold may be implemented and even made adjustable by means of additional circuitry. The pre-amplifier 10 may be implemented using discrete components, which may be a suitable option for low data rates. However, the pre-amplifier 10 may be further implemented as a single integrated circuit. The current source 44 will be activated only, if the DC current component in the signal current I_S is higher than the threshold. Below the threshold, no DC current compensation will be performed by the current source 44. This is advantageous in that, the current source 44 generated noise at the input of the amplifier is reduced. This will increase the sensitivity of the device.

Some offset cancellation may be, however, performed by the transimpedance amplifier stage 14, if the transimpedance amplifier stage 14 is implemented using bipolar IC technology.

Figure 6:
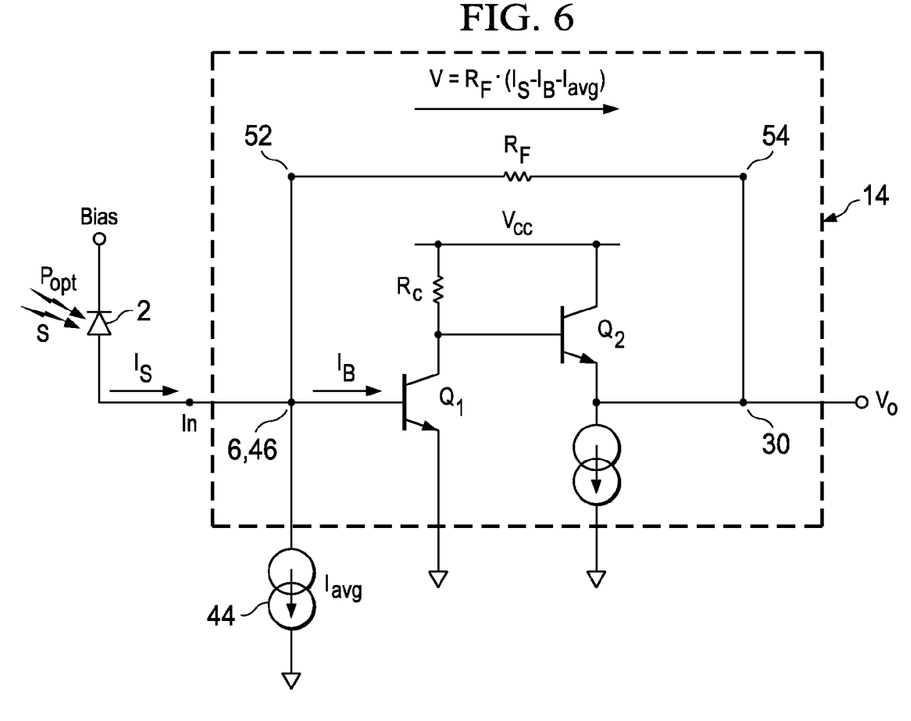
FIG. 6 is a detailed simplified circuit diagram of a transimpedance amplifier stage in an electronic device, according to another embodiment of the invention.

FIG. 6 is a simplified circuit diagram of a transimpedance amplifier stage 14, according to another embodiment of the invention. The transimpedance amplifier stage 14 comprises a first bipolar transistor Q1 and a second bipolar transistor Q2, preferably NPN-transistors. The transimpedance amplifier stage 14 is implemented using two stage architecture with a common emitter gain stage buffered by an emitter follower.

A collector of the first transistor Q1 is coupled to the supply voltage line VCC via a resistor RC. Further, the collector of the first transistor Q1 is coupled to a base of the second transistor Q2. A collector of the second transistor Q2 is directly coupled to the supply voltage line VCC and an emitter of the second transistor Q2 is coupled to the output node 30. This output node 30 is coupled to the inverting input of the gain stage 16 of the preamplifier stage 10 (see FIG. 5).

The offset cancellation stage 38 keeps a DC current across the feedback resistor R_F equal to zero. The average DC current component, which is generated by the photodiode 2, is unidirectional and is greater than zero. The DC current across the feedback resistor R_F is the average DC current component in the signal I_S which is generated by the photodiode 2, minus a base current IB of the bipolar transistor Q1. If the average DC current component in the signal current I_S of the photodiode 2 is smaller than the base current I_B of the bipolar transistor Q1, of the transimpedance-type amplifier stage 14, the current across the feedback resistor R_F will be negative and the voltage drop across the feedback resistor R_F is below zero. Consequently, the current source 44 of the offset cancellation stage 38 is not activated.

Figure 7:
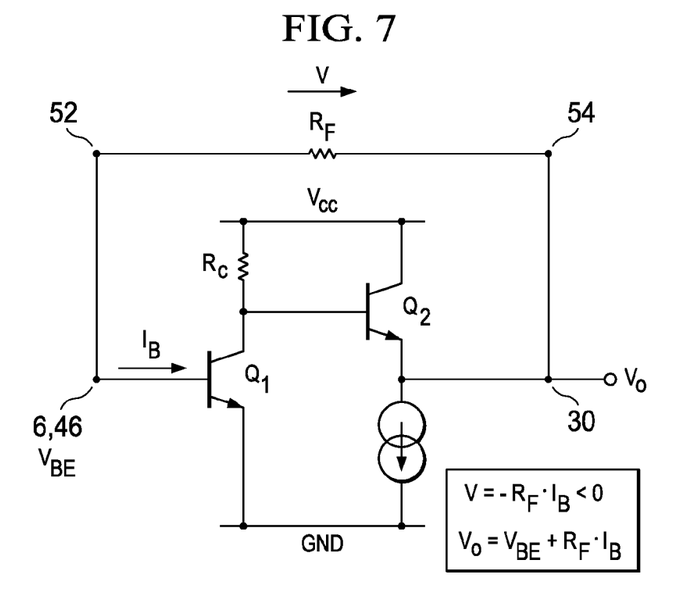
FIG. 7 is the simplified circuit diagram of FIG. 6, wherein a voltage drop which is due to a base current of a bipolar transistor inside the transimpedance amplifier stage is illustrated.

This is further illustrated in the simplified circuit diagram of FIG. 7. The base current I_B of the bipolar transistor Q1 causes a negative voltage drop across the feedback resistor R_F if the DC current component in the photocurrent I_S of the photodiode 2 is smaller than the base current I_B. In other words, for small input currents I_S, the current source 44 is de-activated. As explained previously, the current source 44 at the amplifier's input IN, when activated, contributes noise, thus worsening the sensitivity. For small input currents I_S which are in a range of the base current I_B, which is typically in the order of magnitude of µA, sensitivity is critical but not the dynamic range. There is not subtraction of the average current DC by the current source 44 but a compensation of the DC current component in the signal current I_S of the photodiode 2 due to the base current I_B of the bipolar transistor Q1. This will minimize the noise. The bipolar implementation of the transimpedance amplifier stage 14 has a built-in current source and the additional current source 44 may be de-activated for input currents I_B that are smaller than the base current I_B of the bipolar transistor Q1. Since implementations using common IC technologies yield to base currents in the order of tens µA, it is apparent that the base current I_B induced offset exactly covers the input current I_B range where the transimpedance amplifier stage 14 operates at its sensitivity limit.

Having thus described the invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the invention may be employed without a corresponding use of the other features. Accordingly, it is appropriate that the appended claims be construed broadly and in a manner consistent with the scope of the invention.

The invention claimed is:

1. An electronic device comprising
a transimpedance-type amplifier having a transimpedance stage comprising an amplifier which is coupled in series with an input node of the electronic device,
wherein a feedback resistor is coupled in series between an output node of the amplifier and an input node of the amplifier so as to provide a virtual ground node which is coupled to the input node of the electronic device, to the input node of the amplifier and to the feedback resistor,
wherein a current source is coupled to the virtual ground node so as to compensate for a direct current component in an input signal which is coupled to the input node of the electronic device, and
wherein the electronic device further comprises an offset cancellation stage which is configured to control the current source as a function of a current through the feedback resistor,
wherein the transimpedance-type amplifier stage is configured to draw a DC offset current from the input node of the electronic device,
wherein the transimpedance-type amplifier stage comprises a bipolar transistor having a base which is coupled to the virtual ground node, wherein the DC offset current is a base current of the bipolar transistor which is drawn from the input node of the electronic device.

2. The electronic device according to claim 1, wherein the offset cancellation stage comprises an operational amplifier, and wherein a first input node of the operational amplifier, the feedback resistor and a second input node of the operational amplifier are coupled in series, and an output of the operational amplifier is coupled to the current source so as to control a value of a compensating DC current which is drawn from the virtual ground node by the current source, wherein the value of the compensating DC current is a function of value of the current through the feedback resistor.

3. The electronic device according to claim 2, wherein the current source comprises a transistor, wherein a channel of said transistor is coupled between the virtual ground node and ground, and wherein a gate of said transistor is coupled to the output node of the further operational amplifier.

4. The electronic device according to claim 1, further comprising a low pass filter which is coupled between the transimpedance amplifier stage and the current source.

5. A fiber-optic communication system comprising a photodiode for detection of an optical data signal and an electronic device according to claim 1 for conversion of an output current of the photodiode into a voltage signal for subsequent data processing.

6. A method of operating an electronic device comprising
a transimpedance-type amplifier having a transimpedance stage comprising an amplifier which is coupled in series with an input node of the electronic device, wherein a feedback resistor is coupled in series between an output node of the amplifier and an input node of the amplifier so as to provide a virtual ground node which is coupled to the input node of the electronic device, to the input node of the amplifier and to the feedback resistor, wherein a current source is coupled to the virtual ground node which compensates for a direct current component in an input signal which is coupled to the input node of the electronic device, and wherein the electronic device further comprises an offset cancellation stage which controls the current source as a function of a current through the feedback resistor, wherein the transimpedance-type amplifier stage is configured to draw a DC offset current from the input node of the electronic device, wherein the transimpedance-type amplifier stage comprises a bipolar transistor having a base which is coupled to the virtual ground node, wherein the DC offset current is a base current of the bipolar transistor which is drawn from the input node of the electronic device.

* * * * *